United States Patent [19]
Konishi et al.

[11] Patent Number: 5,728,214
[45] Date of Patent: Mar. 17, 1998

[54] SURFACE TREATMENT OF AN OXIDE LNBA2CU3O7-X SINGLE CRYSTAL

[75] Inventors: Masaya Konishi; Hiroyuki Fuke; Youichi Enomoto; Yuh Shiohara; Shoji Tanaka, all of Tokyo, Japan

[73] Assignees: Sumitomo Electric Industries, Ltd., Osaka; Kabushiki Kaisha Toshiba, Kawasaki; International Superconductivity Technology Center, Tokyo, all of Japan

[21] Appl. No.: 524,490

[22] Filed: Sep. 6, 1995

[30] Foreign Application Priority Data

Sep. 7, 1994 [JP] Japan .................................. 6-240622

[51] Int. Cl.⁶ .................................................. C30B 25/02
[52] U.S. Cl. ........................... 117/94; 117/84; 117/90; 117/921
[58] Field of Search ........................ 117/1, 3, 75, 87, 117/90, 94, 106, 921

[56] References Cited

U.S. PATENT DOCUMENTS 5,274,249  12/1993  Xi et al. ................................ 257/39

OTHER PUBLICATIONS

Terada, et al., "Surface study of . . . by an atomic oxygen beam", 320 Applied Physics Letters, 64(1994) 9 May, No. 19, pp. 2581-2583, Woodbury, NY, US.

"Growth of Ultrathin Y-Ba-Cu-O films by An Off-Axis RF Sputtering Technique", Yang, H.C., et al; Physica C (1 Dec. 1991), vol. 185-189, pt. 3, pp. 1981-1982 (Abstract only).

*Primary Examiner*—Felisa Garrett
*Attorney, Agent, or Firm*—Cushman Darby & Cushman IP Group of Pillsbury Madison & Sutro LLP

[57] ABSTRACT

When a cuprate oxide $LnBa_2Cu_3O_{7-x}$ (Ln=Y, Pr or Sm; $0.30 \leq x \leq 1$) single crystal is heated for growing a film epitaxially on the crystal or for smoothing a damaged surface of the single crystal, many large protrusions occur on the surface of the oxide single crystal substrate or the film. The smooth surface of the oxides becomes rugged by the protrusions. According to the present invention, however, the oxide substrate or the oxide superconductor film can be heated in an atmosphere including oxygen of a partial pressure between 50 mTorr and 200 mTorr to prevent the protrusions from originating on the surface of the heated oxides.

12 Claims, 5 Drawing Sheets

SURFACE TREATMENT OF AN OXIDE LNBA2CU3O7-X SINGLE CRYSTAL

FIELD OF THE INVENTION

This invention relates to a method of surface treating a cuprate oxide $LnBa_2Cu_3O_{7-x}$(Ln=Y, Pr, Sm) single crystal, and in particular, to a method of providing a flat surface to an $LnBa_2Cu_3O_{7-x}$ single crystal substrate or film by eliminating the protrusions appearing on the surface of the $LnBa_2Cu_3O_{7-x}$ single crystal by heating.

BACKGROUND OF THE INVENTION

This application claims priority based on Japanese patent application No.6-240622 (240622/'94) filed Sep. 7th, 1994. Conventional oxide superconductors have been polycrystalline, because they have been made by sintering powder oxide material. Sintering methods cannot produce a single crystal superconductor. Polycrystalline oxide superconductors produced from powder material include many grain boundaries and defects. The defects form potential barriers in the grain boundaries of the polycrystalline superconductors. The occurrence of the potential barriers degrades the conduction property of the superconductors.

Oxide superconductors free from grain boundaries are desired ardently. There are many kinds of oxide superconductors. The problems associated with producing acceptable oxide superconductors are explained herein with reference $YBa_2Cu_3O_{7-x}$, which is more generally referred to as $LnBa_2Cu_3O_{7-x}$(Ln=Y, Pr, or Sm), as examples. $YBa_2Cu_3O_{7-x}$ is one of the most known rare earth oxides. $YBa_2Cu_3O_{7-x}$ is sometimes abbreviated as "YBCO".

Recent technology has succeeded in making large bulk single crystals of the oxide superconductors. Single crystal superconductors exhibit good electrical properties, since single crystals have generally no grain boundaries and little defects. A bulk single crystal cannot serve alone as a film of electronic and other devices; rather, production of these devices still requires piling thin films on the bulk single crystal substrate.

If a good oxide superconductor bulk single crystal is obtained, the surface of the bulk single crystal should be polished and thin films should epitaxially be deposited on the bulk single crystals in order to facilitate fabrication of electronic devices. Both oxide superconductive substrates and oxide superconductive films have strong electric anisotropy. Thus the interface between the substrate and the surface of the film must be sufficiently smooth.

The substrate can be polished to provide it with a smooth surface. The substrate should be heated in order to grow thin films on the substrate epitaxially. In general, epitaxial growth never occurs on a substrate at room temperature. The growth of films requires a hot substrate. Pulse laser ablation method or sputtering method is generally used for the epitaxial growth of oxide superconductor films on a heated substrate. The pulse laser ablation method makes a film by the steps of heating the substrate to an acceptable temperature, introducing oxygen gas in the reaction chamber, irradiating a target containing the material for the film by pulsed ultraviolet rays of the laser, evaporating the film material from the target, conveying the film material to the substrate and piling the film on the hot substrate. The sputtering method produces a film by the steps of bombarding a target made of the material of the film with argon ion beams, carrying the molecules of the material to the substrate and piling the material on the heated substrate.

THE PROBLEMS TO BE SOLVED

In these conventional techniques, the substrate is always heated for growing oxide superconductor films on the oxide superconductor substrate. During heating, many protrusions arise on the surface of the $LnBa_2Cu_3O_{7-x}$ substrate. The protrusions are induced only by heating the $LnBa_2Cu_3O_{7-x}$ substrate which has been perfectly smoothed just before heating. Without etching or sputtering, heating nevertheless generates the rugged surface of the oxide superconductor substrate. Raising temperature invites the occurrence of lots of protrusions on the $LnBa_2Cu_3O_{7-x}$ substrate.

This is a new phenomenon discovered by the Inventors of the present invention for the first time. Since a large oxide superconductor single crystal was not developed until recently, until now nobody has been aware of such a strange fact. The protrusions appear only on a single crystal oxide superconductor substrate. This strange phenomenon does not arise in a polycrystalline superconductor substrate, even if the polycrystalline substrate is heated at a high temperature. There may be a large difference between a single crystal oxide superconductor and a polycrystalline oxide superconductor with respect to their reaction to heating. The protrusions which appear on a single crystal oxide superconductor in heating are sometimes higher than 30 nm. These protrusions are relatively high. When a single crystal oxide superconductor is heated, such high protrusions arise over the entire surface of the single crystal superconductor and can decrease the smoothness of the surface, making the superconductor useless. If a film is grown on a substrate having the rough surface, the interface between the substrate and the film will have a roughness similar to that of the surface of the substrate, since the growing film transcribes the morphology of the surface of the substrate. If a superconducting device is produced on the film, the rough junction between the film and the substrate degrades the utility of the device.

Superconductor substrates are sometimes heated for another purpose other than epitaxial growth. For example, substrates are annealed for the purpose of eliminating damage to the surface. Annealing is often employed for other materials. For example, a part of a surface of wafers can be removed by ion etching for eliminating a superficial degenerate layer in the case of semiconductors Si, GaAs or InP. The degenerate layer can be removed. The surface, however, is greatly damaged by ion etching. Then the wafers are heated above 400° C. for polycrystalline materials, the annealing generally removes the superficial damage from the substrate wafer. In the case of a single crystal oxide superconductor, however, the annealing induces many protrusions on the surface of the substrate. Although the monocrystalline superconductor has been polished into a smooth surface, the surface is degraded into a rugged one by the annealing, which has the object of enhancing the quality of the substrate in general. Such a strange phenomenon never occurs in the case of ordinary semiconductors or metals. The phenomenon has been discovered by the Inventors of the present invention as being particular to single crystal oxide superconductors.

The phenomenonal turns out to appear in all single crystal oxide superconductors represented by $LnBa_2Cu_3O_{7-x}$ for Ln=Y, Pr or Sin. The Inventors investigated the critical temperature at which the micro-protrusions originate on the surface, in the case of $YBa_2Cu_3O_{7-x}$. Heating the YBCO at 300° C. does not invite the surface protrusions. When the YBCO single crystal is heated at 400° C., micro-protrusions appear on the surface of the single crystal. Surface protrusions do not arise when the YBCO single crystal is heated to a temperature below 300° C.

Heat-treatment below 300° C., however, can scarcely accomplish the purpose of the treatment. For example, heating the superconductor substrate at a temperature less than 300° C. is insufficient for a good epitaxial growth of films on the substrate. Similarly, heating the object at a temperature below 300° C. is nearly ineffective for eliminating damage to the surface. Almost all the heat-treatments demand a temperature higher than 400° C.

Why do the protrusions originate on the monocrystalline oxide superconductor when it is heated? The problem is why the high temperature yields the roughness of the surface. For most materials other than the present oxide superconductors, the roughness of the surface is generally induced by the contaminants or the degenerate layer. The microprotrusions, however, originate even on a clean, smooth monocrystalline substrate which has been polished and wet-etched for eliminating the superficial degenerate layer. Thus the protrusions are not caused by the contamination or the surface degenerate layer.

SUMMARY OF THE INVENTION

A purpose of the present invention is to provide a method of heating a flat, smooth oxide single crystal of $LnBa_2Cu_3O_{7-x}$(Ln=Y, Pr or S) without introducing protrusions on the surface.

Another purpose of the present invention is to provide a method of heating a smooth substrate of $LnBa_2Cu_3O_{7-x}$(Ln=Y, Pr or S) for epitaxial growth of films without inviting roughness on the surface.

Yet another purpose of the present invention is to provide a method of annealing a substrate of $LnBa_2Cu_{3-x}$(Ln=Y, Pr of S) having superficial damage resulting from polishing or etching without an occurrence of protrusions.

A further purpose of the present invention is to provide a method for preventing protrusions from arising on the surface of a substrate $LnBa_2Cu_3O_{7-x}$(Ln=Y, Pr or S) when the substrate is heated for achieving various objects.

The origin of the protrusions is neither contamination nor degeneration of the substrate. The protrusions must be induced by a change in the structure of the single crystal $LnBa_2Cu_3O_{7-x}$ itself. The Inventors consider that the structural change of the single crystal causes protrusions to form on the oxide superconductor crystal. Why does the structural change occur in the single crystal superconductor?

In general, any treatment is defined by the treatment conditions, including parameters such as temperature, pressure, and atmosphere, and the time change of the parameters. Temperature is, in many cases, selected by the objective of the treatment. Temperature is not a freely-controllable parameter. On the contrary, the kind of the atmospheric gas and the pressure of the atmospheric gas are the parameters which can freely be chosen.

The oxide superconductors were heated under various pressures of various atmospheric gases for examining the dependence of the occurrence of protrusions relative to the atmospheric gas and the pressure. The atmospheric gases were selected from rare gases, nitrogen gas, oxygen gas, halogen gases and mixture gases of them. The experiment indicated that rare gases are ineffective for suppressing the protrusions from originating. Nitrogen gas is also ineffective. Halogen gas cannot forbid the formation of the protrusions. The Inventors have discovered that only oxygen gas can prevent the protrusions from arising on the surface and maintain the smoothness of the surface of the oxide superconductors. Gases, other than are all inept at suppressing the origination of the protrusions.

Oxygen gas is therefore preferably selected as the atmospheric gas for the heat treatment of monocrystalline oxide superconductors. In particular, 50 m Torr (6.6 Pa) to 200 mTorr (26.6 Pa) is the optimum partial pressure of oxygen gas for such heat treatment. If the partial pressure of oxygen is less than 50 mTorr (6.6 Pa), protrusions occur on the surface of the single crystal superconductors. On the other hand, a partial pressure of more than 200 mTorr (26.6 Pa) of oxygen is still fully effective to hinder the protrusions from appearing on the substrate surface. The surface, however, becomes rough due to oxidization, when the oxygen partial pressure is higher than 200 mTorr. The roughness caused by oxidization is different from the ruggedness due to heating, since the height of the convexes induced by oxidization is several nanometers, which is far lower than the protrusions caused by heating. However, the roughness caused by oxidization is also undesirable for the substrate crystal. Thus the optimum partial pressure of oxygen ranges from 50 mTorr (6.6 Pa) to 200 mTorr (26.6 Pa).

The occurrence of protrusions due to heating has been a common fault for all oxide superconductor single crystals of $LnBa_2Cu_3O_{7-x}$(Ln=Y, Pr, Sm). The method of this invention has turned out to be effective for all single crystal expressed by the formula $LnBa_2Cu_3O_{7-x}$(Ln=Y, Pr, Sm). In the Formula $LnBa_2Cu_3O_{7-x}$, "x" means the defect number of oxygen from 7. The electric property depends on the defect number "x". Of course, x is less than 1.

The oxide $LnBa_2Cu_3O_{7-x}$ takes a value, in general, from 0 to 1 for x ($0 \leq x \leq 1$). When x=0, the number of oxygen atoms in a molecule is 7. When x=1, the oxygen atom number is 6. Samples having a smaller number of oxygen atoms, i.e., when x is nearly equal to 1, reduce the defect number x by absorbing oxygen atoms, when the sample is heated in oxygen gas. On the other hand, the other samples having a larger number of oxygen atoms will increase the number x by dispersing oxygen atoms when they are heated in anaerobic atmosphere, for example, in vacuum or in an inert gas. Big single crystal oxide superconductors which can be produced by current technology have an insufficient amount of oxygen atoms, since they have been grown at a high temperature. Thus at present, $0.3 \leq x \leq 1$ is the scope for the value x of a superconducting $LnBa_2Cu_3O_{7-x}$ (Ln=Y, Sm). $PrBa_2Cu_3O_{7-x}$ is not superconductive for all values of x ($0 \leq x \leq 1$). Moreover a $LnBa_2Cu_3O_{7-x}$(Ln=Y, Sm) does not show superconductivity in the range $0 \leq x \leq 0.3$. However, these oxide single crystal substrates $LnBa_2Cu_3O_{7-x}$(Ln=Y, Sm or pr; $0 \leq x \leq 1$) are useful as the substrates for the growth of the superconductor films $LnBa_2Cu_3O_{7-x}$(Ln=Y, Sm; $0.3 \leq x \leq 1$).

When the Inventors originally approached this problem, they believed that if the oxide superconductors were heated in an oxygen atmosphere, the oxide crystal would change the crystal structure by absorbing oxygen atoms, thereby making the surface of the crystal rough. On the other hand, the Inventors also believed that no structural change would be induced in the oxide single crystal, if it was heated in vacuum.

The Inventors thought that if the oxide superconductor was heated in vacuum, no structural change would occur. That is, the Inventors believed that no change of the structure and no dissociation of the crystal should arise, when the oxide superconductor crystal is heated up to 400° C. in a vacuum of about $10^{-6}$ Torr. However, under this vacuum condition it was discovered that on the surface, some parts of lattice structure were dissolved due to the imperfection of lattice at such a low temperature and were converted into foreign parts of different components. Then the foreign parts grew as protrusions. Namely, the imperfection of the lattice allowed oxygen atoms to dissociate from the surface and induce the growth of the protrusions which are foreign parts produced by the escape of oxygen atoms. In order to avoid this problem, this invention heats oxide superconductors under the atmosphere of oxygen for preventing oxygen atoms from escaping out of the surface. The Inventors have confirmed that no protrusion happens on the surface, if the escape of oxygen atoms is suppressed. Then the reason which causes the occurrence of the protrusions has been solved. Conventionally, thin films of the oxide superconductor have been produced by preparing a single crystal MgO or a single crystal $SrTiO_3$ as a substrate, heating the substrate in vacuum and depositing oxide superconductor films on the heated substrate. For example, the films were produced on a MgO or $SrTiO_3$ substrate after being heated in a vacuum of $10^{-5}$ Torr to $10^{-5}$ Torr.

This invention rejects using a vacuum as the atmosphere for heating a superconductor single crystal substrate. On the contrary, this invention adopts a non-vacuum atmosphere including oxygen with a partial pressure between 50 mTorr (6.6 Pa) and 200 mTorr(26.6 Pa). The requirement for the atmosphere is only with respect to the partial pressure of oxygen. Thus the atmosphere can include gases other than oxygen, although other gases have no function for suppressing the ruggedness of the surface.

Oxygen atoms do not dissociate from the lattice structure of the substrate crystal, since the substrate is heated under the atmosphere of oxygen gas in the present invention. Then no protrusion originate on the surface, because the protrusions have been caused by the dissociation of oxygen atoms from the surface. This invention has succeeded in (and selected) suppressing the protrusions from occurring, even if the oxide superconductor is heated up to a high temperature between 400° C. and 800° C.

The atmosphere for heating an $LnBa_2Cu_3O_{7-x}$ single crystal substrate has not been investigated in detail. Generally, it is considered that heating the oxygen deficient $LnBa_2Cu_3O_{7-x}(0.3 \leq x \leq 1)$ in oxygen atmosphere caused oxidization. However, this invention which heats the oxide in such a high oxygen pressure of 50 mTorr sharply contradicts the common belief that in-vacuum heating of the oxide superconductors would be most effective for suppressing protrusions.

The Inventors, however, have confirmed that the oxide superconductors are not oxidized by heating in oxygen gas of 50 mTorr. Furthermore, the Inventors have verified the fact that the protrusions arise due to the escape of oxygen, when the oxide is heated under the oxygen partial pressure less than 50 mTorr.

By contrast, if a $YBa_2Cu_3O_{7-x}$ crystal is heated in an oxygen atmosphere of 1 atm (760 Torr, 0.1 MPa), the surface of the crystal is oxidized and the lattice of surface is distorted by oxidization. The surface is rugged by the distortion of the lattice structure. The oxygen pressure less than 1000 mTorr (133 Pa) enables the oxide superconductors to avoid both the occurrence of the protrusions and the oxidization on the surface. The surface of $LnBa_2Cu_3O_{7-x}$, however, is gradually oxidized to some extent in oxygen gas of a pressure between 200 mTorr (26.6 Pa) and 1000 mTorr(133 Pa). Thus the optimum range of the partial pressure of oxygen is 50 mTorr to 200 mTorr.

The advantages of the present invention are explained. This invention provides various heat treatment methods to heat $LnBa_2Cu_3O_{7-x}$ single crystals without the occurrence of protrusions. The single crystals can be heated without becoming rough in accordance with the present invention.

If the present invention is applied to an annealing treatment for eliminating the inner strain of the oxide superconductors, no protrusion is formed on the surface of the oxides. This invention allows the annealing treatment to make a crystal with flat, smooth surfaces immune from protrusions.

If the present invention is applied to the epitaxial growth of the thin films of superconductors on a superconductor $LnBa_2Cu_3O_{7-x}$ single crystal substrate, no protrusion is generated both on the substrate and on the films, even at a high temperature. The epitaxy succeeds in producing extremely flat, smooth films on the oxide superconductor substrates owing to the oxygen atmosphere proposed by the present invention.

DETAILED DESCRIPTION OF THE PREFERRED EMBODIMENTS

[EMBODIMENT ①: Heating for recovering from a damaged state]

A smooth-polished $YBa_2Cu_3O_{7-x}$ single crystal was etched by ion beams. The single crystal was damaged by the bombardment of the ion beams. The RHEED patterns (reflective high energy electron beam diffraction) vanished as the results of the damage caused by the bombardment. The extinction of the RHEED patterns means random disorder of the lattice structures on the surface. The single crystal was annealed in a vacuum chamber for removing the damage from the crystal surface.

One sample (sample A) was heated in oxygen gas of 100 mTorr up to 500° C. according to the teaching of the present invention. The other $YBa_2Cu_3O_{7-x}$ sample (sample B) was heated in vacuum of $10^{-6}$ to $10^{-5}$ Torr ($10^{-4}$ Pa to $10^{-3}$ Pa) up to 500° C. according to the conventional annealing. Both samples were kept at 500° C. for a certain time. Then the samples were cooled and taken out of the chamber. Then the samples were examined by the RHEED method. The RHEED patterns with streaks appear in both samples A and B. The appearance of the RHEED patterns means that the regular order of the lattice structures were recovered. Sample A and sample B were similar to each other in this respect.

Figure 1A:
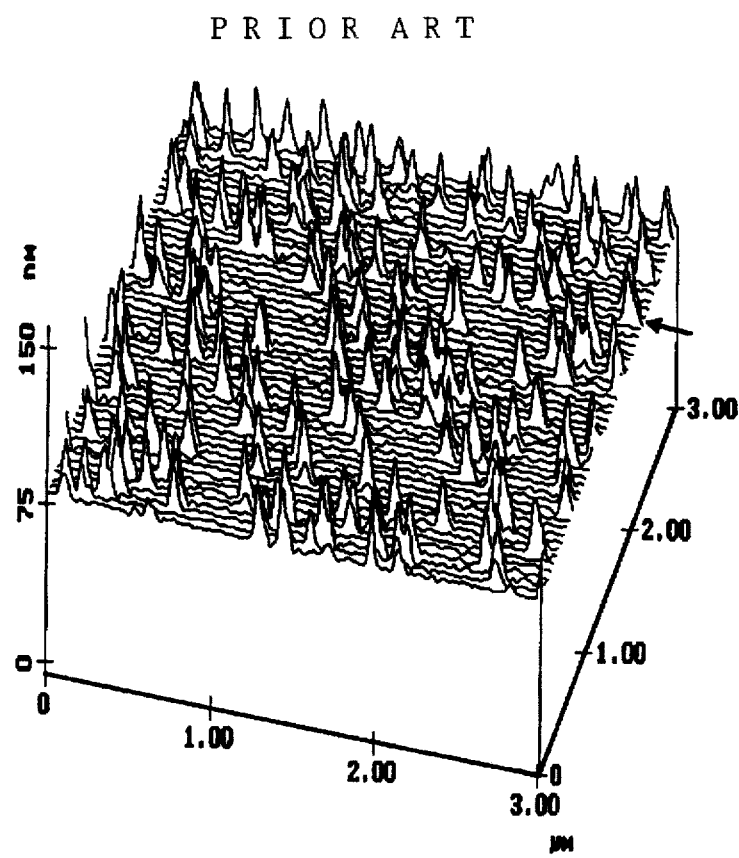
FIG. 1(a) is a perspective view of a computer generated representation of the surface, including the heights of protrusions of a part 3 µm×3 µm of the surface of a $YBa_2Cu_3O_{7-x}$ single crystal observed by an AFM (atomic force microscope), which has been annealed at a temperature of 500° C. in vacuum according to the conventional annealing in order to eliminating the damage induced by the ion etching.
Figure 1B:
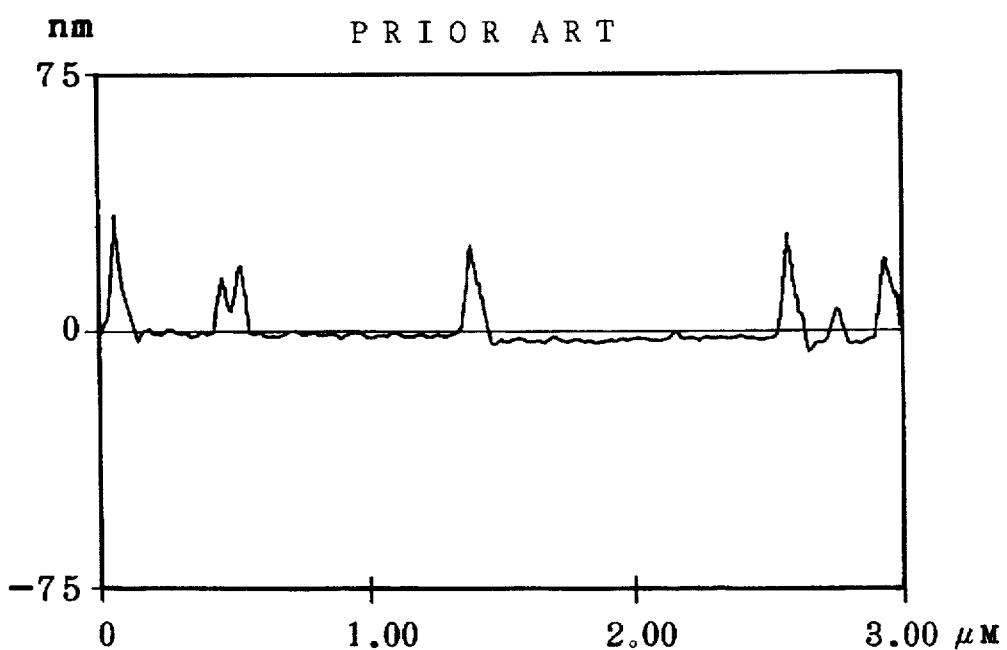
FIG. 1(b) is a graph showing the distribution of the heights of protrusions on the surface in a direction indicated by an arrow in FIG. 1(a). The abscissa is the distance (µm) across the face of the single crystal protrusions on the ordinate is the heights (nm) of the surface along the line indicated by the arrow.

The recovery of the lattice order does not necessarily mean the recovery of the smoothness of the surface of the crystal. To demonstrate this point, the samples A and B were observed by the AFM (atomic force microscope). FIG. 1 shows the result of the observation of sample B (vacuum annealing). FIG. 1(a) indicates the changes on the height of the surface in a 3 μm×3 μm square by an assembly of 50 lines stretching in the X-direction with a spacing of 60 nm. The abscissa denotes the distance (μm) in the X-direction. The ordinate indicates the height of the surface, including the heights (nm) of the protrusions. FIG. 1(b) shows the heights on the line indicated by the arrow in FIG. 1(a). Sample B which had been heated in vacuum exhibited a lot of protrusions randomly distributed on the surface.

Some protrusions have a broadness less than 60 nm. The other protrusions have a broadness more than 60 nm and are so bread that they appear at corresponding positions in two neighboring lines. The heights of the protrusions ranged from 10 nm to 30 nm. The numbers and height of the protrusions were so high that the crystal could not be adopted as a substrate for film formation. The section shown in FIG. 1(b) had seven protrusions in a 3 μm length. This meant that the protrusions happened at a higher frequency. The vacuum-annealing resulted in producing a lot of high protrusions on the surface.

Figure 2A:
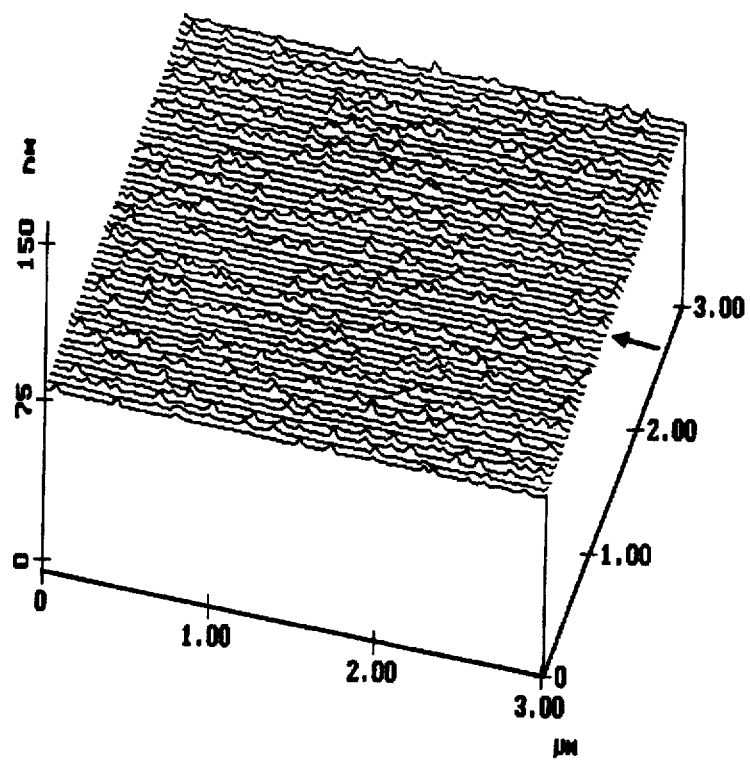
FIG. 2(a) is a perspective view of a computer generated representation of the surface, including the heights of protrusions on the surface of a part 3 µm×3 µm of the surface of a $YBa_2Cu_3O_{7-x}$ single crystal observed by an AFM surface has been annealed at a temperature of 500° C. in oxygen gas of a pressure of 100 mTorr according to the teaching of the present invention in order to remove the damage induced by the ion etching.
Figure 2B:
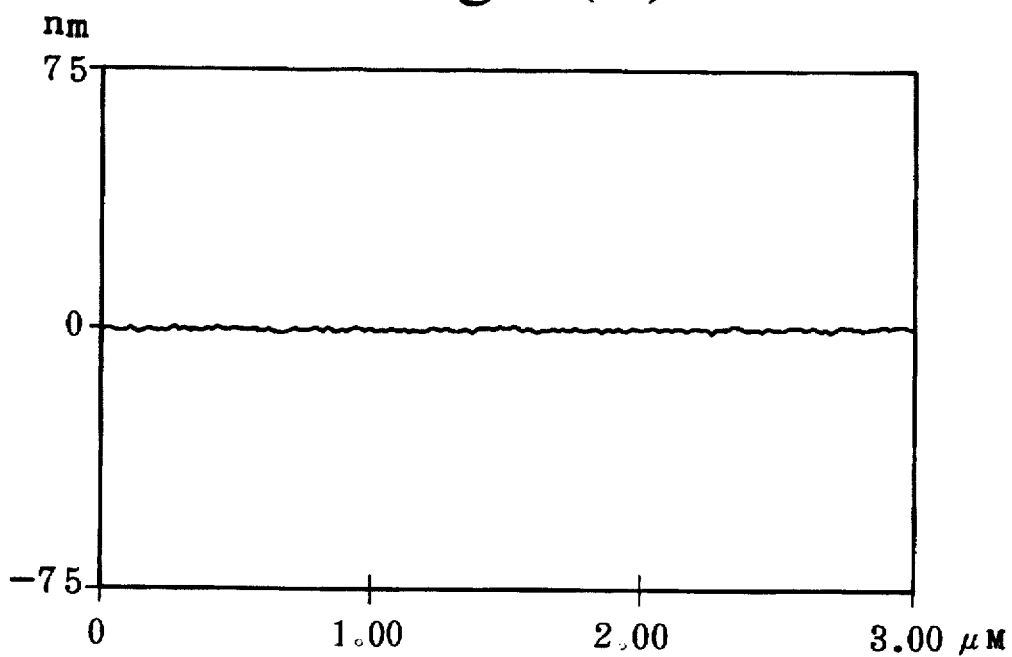
FIG. 2(b) is a graph of the distribution of the heights of the protrusions on the surface in a direction indicated by an arrow in FIG. 2(a). The abscissa is the distance (µm) across the face of the single crystal. The ordinate is the heights (µm) of the protrusions on the surface along the line indicated by the arrow.

FIG. 2(a) indicates the changes to the height of the surface in a 3 μm×3 μm square of sample A by an assembly of 50 lines stretching in X-direction with a spacing of 60 nm. The abscissa denotes the distance (μm) in the X-direction. The ordinate indicates the heights (nm). FIG. 2(b) shows the heights on the line indicated by the arrow in FIG. 2(a). Sample A which had been annealed in oxygen of 100 mTorr had a very smooth surface. There was no protrusion in the square of 3 μm×3 μm of the surface of sample A. FIG. 2(b) shows no disorder on the surface in the X-direction. The surface was quite flat and smooth without protrusions. Sample A and sample B were annealed under the same conditions, except for the presence or absence of an oxygen atmosphere. Sample B was heated in vacuum. Sample A was heated in oxygen gas. The conspicuous difference in the smoothness of the surfaces was caused by the existence or the non-existence of oxygen. These experiments verified the effectiveness of the present invention.

[EMBODIMENT:② Heating for epitaxial growth of films]

Single crystal oxide superconductor films were grown on $YBa_2Cu_3O_{7-x}$ single crystal substrates by the sputtering method. The heating for the epitaxy may cause the protrusions on the films. The sample made by the method of the present invention (in oxygen) is named sample C. The other sample made by the conventional method (in vacuum) is named sample D.

Figure 3:
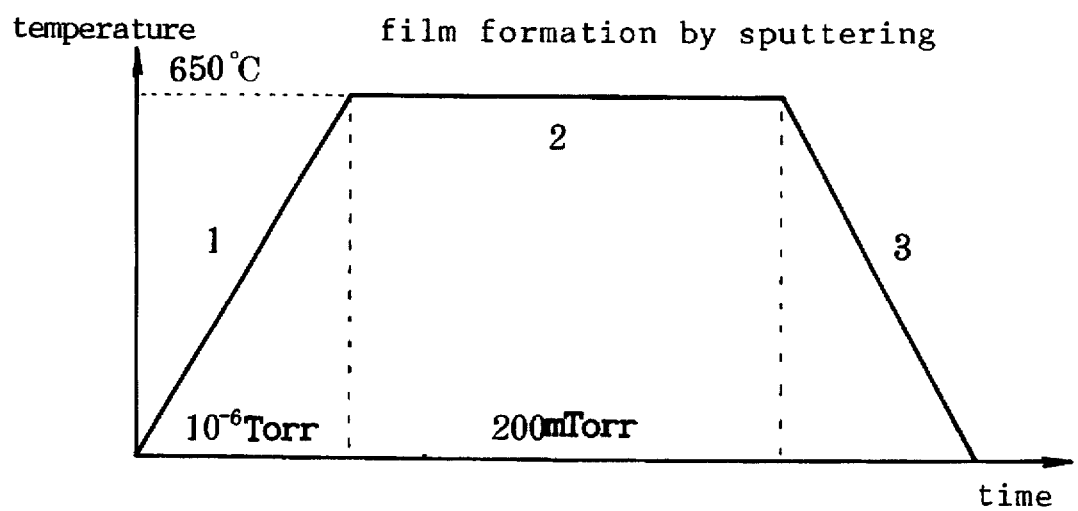
FIG. 3 is a graph showing the time-dependence of the temperature in the film formation of a $YBa_2Cu_3O_{7-x}$ film on a $YBa_2Cu_3O_{7-x}$ single crystal substrate in vacuum of $10^{-6}$ Torr by the conventional sputtering method.

FIG. 3 indicates a graph showing the time-dependent change of the temperature of the conventional sputtering. The abscissa is the time. The ordinate is the temperature. The chamber is kept to be vacuous ($10^{-6}$ Torr). The epitaxy consists of only three steps of: (1) a temperature-rising process (2), a sputtering process (2) and a temperature-falling process (3). The substrate was heated up to 650° C. in vacuum of $10^{-6}$ Torr in process (1). Then a mixture gas including oxygen gas of 90% and argon gas of 10% was introduced into the reaction chamber. The total pressure was adjusted at 200 mTorr. The gas was excited into plasma. The target made of the oxide superconductor material was bombarded by the plasma. Then a $YBa_2Cu_3O_{7-x}$ film was deposited on the heated substrate in process (2). Then the substrate was cooled to room temperature in process (3).

Figure 4:
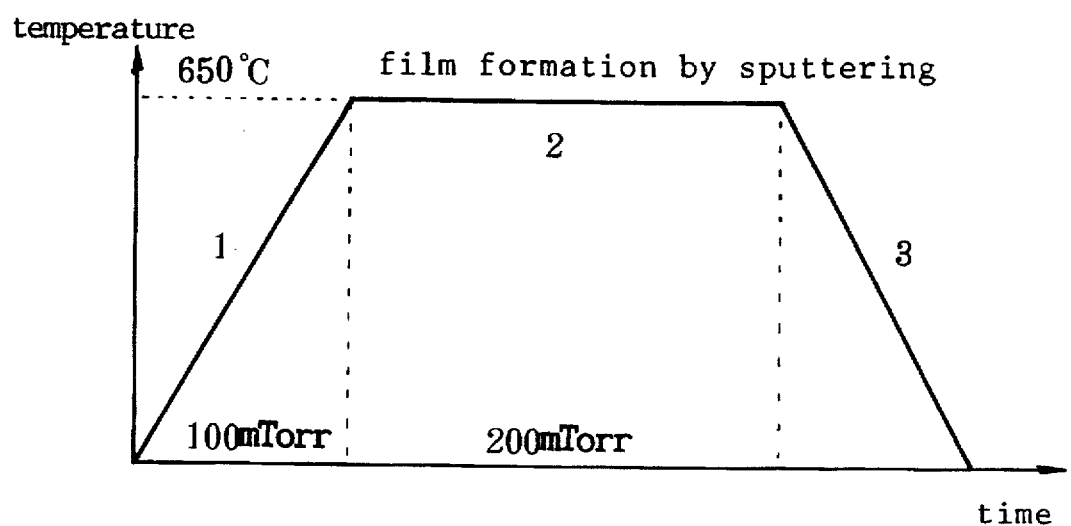
FIG. 4 is a graph showing the time-dependence of the temperature in the film formation of a $YBa_2Cu_3O_{7-x}$ film on a $YBa_2Cu_3O_{7-x}$ single crystal substrate in oxygen of a pressure of 90 mTorr by the conventional sputtering method modified by the present invention.

FIG. 4 denotes a graph showing the processes of the sputtering by the present invention. The sputtering consists of three steps of a temperature-rising process (1), a sputtering process (2) and a temperature-falling process (3). The profile of the time-dependent change of the temperature is similar to the conventional one of FIG. 3. The temperature of sputtering was also the same as in the conventional method. The target ($YBa_2Cu_3O_{7-x}$ polycrystal) was also common to the conventional one. The only difference was the atmosphere in the reaction chamber in the temperature-rising process (1). The conventional method raised the temperature in vacuum.

The present invention raised the temperature process (1) under in the atmosphere of 100 mTorr having argon gas of 10% and oxygen gas of 90%. The partial pressure of oxygen in process (1) was 90 mTorr. The partial pressure of argon gas in the same process was 10 mTorr. The total pressure was doubled after completion of process (1) and before commencement of process (2). The partial pressure of oxygen was 180 mTorr in process (2). The partial pressure of argon was 20 mTorr in process (2). The components and the ratio of components were kept constant for process (1), process (2) and process (3). The reason why argon gas is included in the atmospheric gas was that the sputtering technique requires argon gas. Thus, argon gas was not necessary for process(1). It was more convenient to adopt a mixture gas also for the temperature-rising process (1), since there is no need to change the components of the gas between process (1) and process (2).

Only the partial pressure of oxygen gas plays the role of suppressing the oxygen atoms from escaping out of the lattices and preventing the protrusions from arising on the surface. Partial pressures of other gases are irrelevant to the suppression of the occurrence of protrusions. The other gases do not facilitate the origination of the protrusions. Therefore, other gases can freely be contained in the atmospheric gas. In this case, argon gas was added in the gas for inducing the sputtering.

Figure 5A:
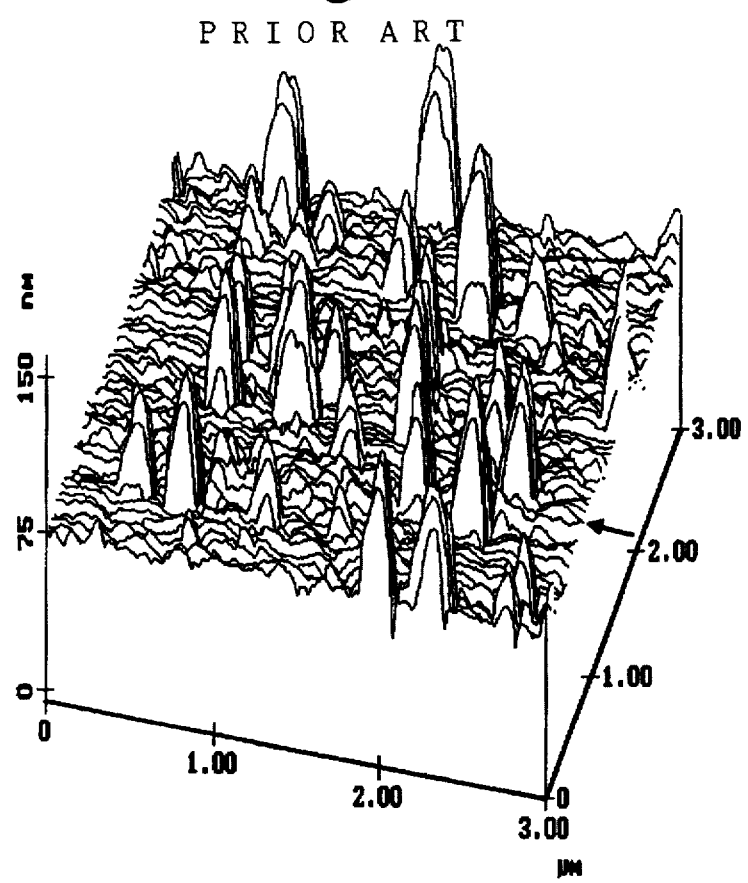
FIG. 5(a) is a perspective view of a computer generated representation of the surface, including the heights in a of protrusions on the surface of a part 3 µm×3 µm of a $YBa_2Cu_3O_{7-x}$ single crystal film (sample D) observed by an AFM (atomic force microscope); which film has been epitaxially grown on a $YBa_2Cu_3O_{7-x}$ single crystal substrate which had been treated with the heating process in vacuum of $10^{-6}$ Torr according to the conventional method.

FIG. 5 shows the result of the AFM (atomic force microscope) observation of a part of 3 μm×3 μm of the film surface of sample D which was made by the conventional method. The distributions of the heights in, X-direction are denoted by an assembly of continual lines. Fifty lines are arranged with a common spacing of 60 nm. The abscissa is the distance (μm) in the XY plane. The ordinate is the height (nm) of the surface. Many high protrusions were produced on the surface. The heights were distributed from 50 nm to 90 nm. In particular, there were many protrusions of about 70 nm height. The protrusions on the films of FIG. 5 were far wider and taller than the protrusions on the substrate shown in FIG. 1. The protrusions were so wide that a plurality of neighboring lines corresponded with the same peaks. The reason why the protrusions on the films of FIG. 5 were bigger and wider than the protrusions on the substrate of FIG. 1 is that the temperature (650° C.) for the film formation was higher than the temperature (500° C.) for the annealing. Such high protrusions will make a lot of defects at the junction which will be formed on the rough films and make it impossible to produce a good junction.

Figure 5B:
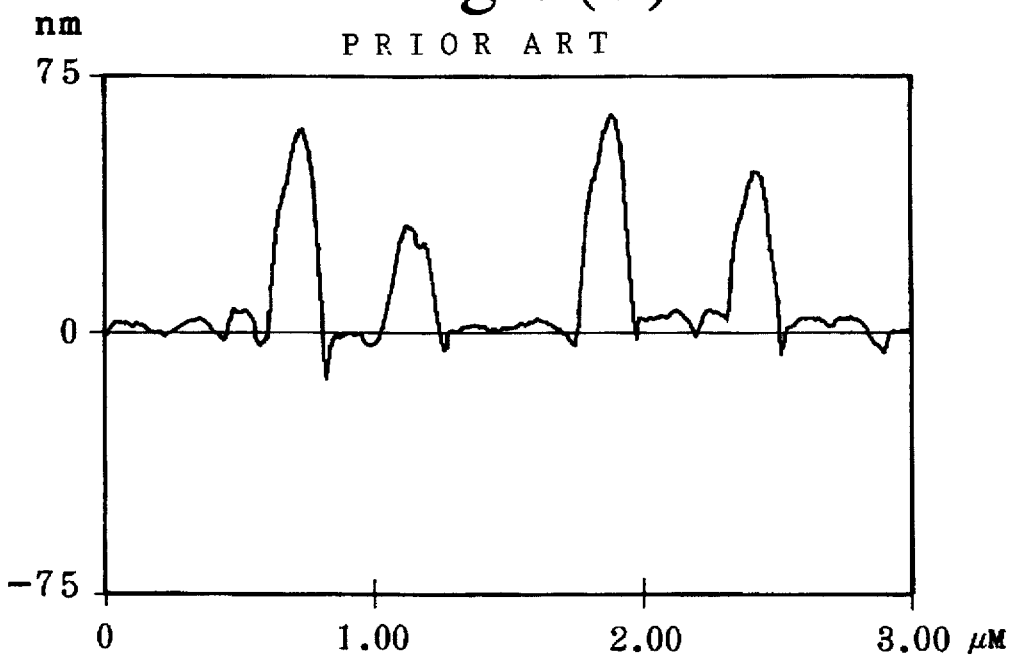
FIG. 5(b) is a graph showing the distribution of the heights the protrusions on the surface in a direction indicated by an arrow in FIG. 5(a). The abscissa is the distance (µm) across the face of the film. The ordinate is the heights (nm) of the protrusions on the surface along the line.

By contrast, the density of the film protrusions (FIG. 5) is lower than the density of the substrate protrusions (FIG. 1). The smaller density may be caused by unification of protrusions. FIG. 5(b) indicates the line of heights in X-section indicated by an arrow in FIG. 5(a). The line has four peaks which were about 60 nm in height, as opposed to the seven peaks of 10 nm to 30 nm shown in FIG. 1(a).

Figure 6A:
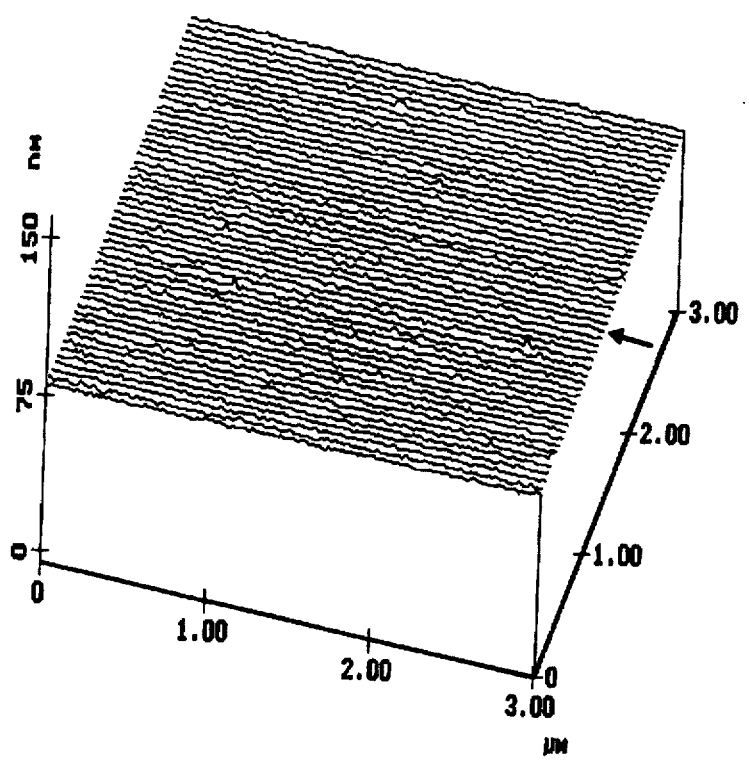
FIG. 6(a) is a perspective view of a computer generated representation of the surface, including the heights of protrusions on the surface of a part 3 μm×3 μm of a $YBa_2Cu_3O_{7-x}$ single crystal film (sample C) observed by an AFM (atomic force microscope) which has been epitaxially grown on a $YBa_2Cu_3O_{7-x}$ single crystal substrate which had been treated with the heating process in oxygen of a pressure of 90 mTorr by the sputtering method modified by the present invention.
Figure 6B:
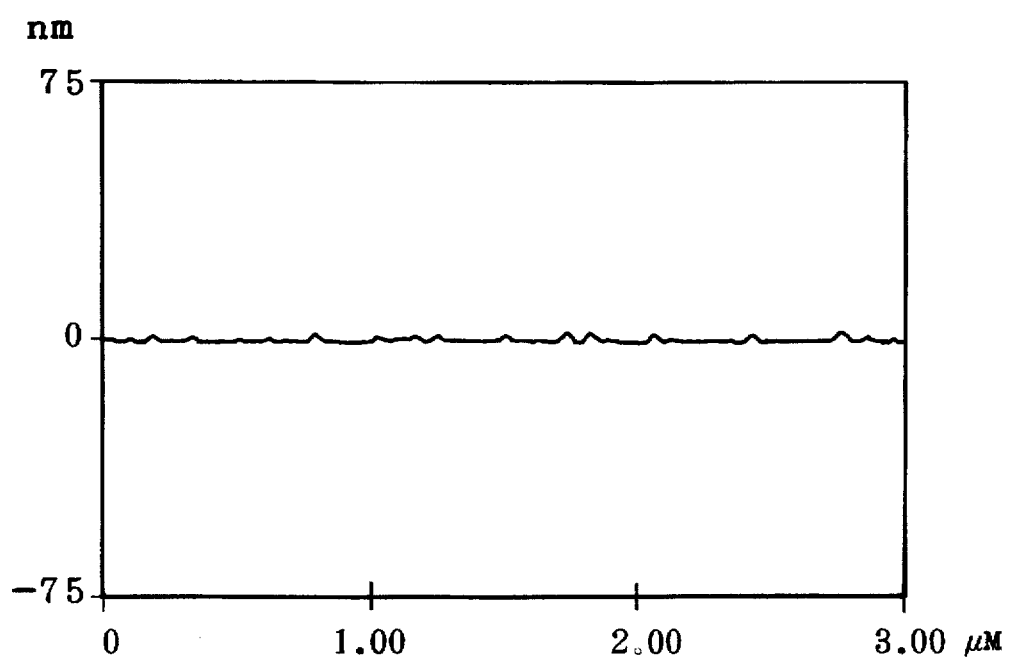
FIG. 6(b) is a graph showing the distribution of the heights of the protrusions on the surface in a direction indicated by an arrow in FIG. 6(a). The abscissa is the distance (μm) across the face of the film. The ordinate is the heights (nm) the protrusions on along the line indicated by the arrow.

FIG. 6 shows the result of the AFM observation of the epitaxial film (sample C) produced by the teaching of the present invention. FIG. 6(a) indicates the 2-dimensional distribution of the heights in a part of 3 μm×3 μm of the epitaxial film. FIG. 6(b) shows the distribution in X-direction denoted by an arrow in FIG. 6(a). The surface was very smooth. The differences between peaks and valleys were lower than 5 nm. No protrusion was formed. The heights of the protrusions of the epitaxial film were less than the heights of the protrusions of the substrate of FIG. 2 (sample A). The conditions selected for preparing sample C and sample D differed from each other only with regard to the fact whether the atmosphere gas included oxygen gas or not. The result of the experiment verifies the fact that oxygen gas effectively prevents the protrusions from originating on the single crystal oxide superconductors. Thus this invention succeeds in making good oxide superconductor films and junctions which excel in the smoothness and flatness.

What we claim is:

1. A process of surface treating an oxide $LnBa_2Cu_3O_{7-x}$ single crystal comprising heating the $LnBa_2Cu_3O_{7-x}$ single crystal at a temperature higher than 400° C. in an atmosphere including oxygen gas of a partial pressure between 50 mTorr and 200 mTorr, wherein Ln=Y, Pr or Sm, and wherein $0.3 \leq x \leq 1$.

2. A process according to claim 1, wherein the atmosphere also includes at least one member selected from the group consisting of a rare gas, nitrogen gas, and a halogen gas.

3. A process according to claim 1, wherein the atmosphere also includes argon gas.

4. A process according to claim 1, said process further comprises annealing said single crystal.

5. A process of surface treating an oxide $LnBa_2Cu_3O_{7-x}$ single crystal having at least one damaged surface comprising heating the $LnBa_2Cu_3O_{7-x}$ single crystal at a temperature higher than 400° C. in an atmosphere including oxygen gas of a partial pressure between 50 mTorr and 200 mTorr, wherein Ln=Y, Pr or Sm, and wherein $0.3 \leq x \leq 1$.

6. A process according to claim 5, wherein the atmosphere also includes at least one member selected from the group consisting of rare gases, nitrogen gas, and halogen gas.

7. A process according to claim 5, wherein the atmosphere also includes argon gas.

8. A process according to claim 5, said process further comprises annealing said single crystal.

9. A process of surface treating an oxide $LnBa_2Cu_3O_{7-x}$ single crystal comprising the steps of:

heating an $LnBa_2Cu_3O_{7-x}$ single crystal substrate at a temperature between 400° C. and 800° C. in an atmosphere including oxygen gas of a partial pressure between 50 mTorr and 200 mTorr; and depositing an $LnBa_2Cu_3O_{7-x}$ film (Ln=Y, Pr or Sm) on the $LnBa_2Cu_3O_{7-x}$ substrate, wherein Ln=Y, Pr or Sm, and wherein $0.3 \leq x \leq 1$.

10. A process according to claim 9, wherein the atmosphere also includes at least one member selected from the group consisting of rare gases, nitrogen gas, and halogen gas.

11. A process according to claim 9, wherein the atmosphere also includes argon gas.

12. A process according to claim 9, said process further comprises annealing said single crystal.

* * * * *